(12) United States Patent
Subbareddy et al.

(10) Patent No.: US 11,056,452 B2
(45) Date of Patent: Jul. 6, 2021

(54) INTERFACE BUS FOR INTER-DIE COMMUNICATION IN A MULTI-CHIP PACKAGE OVER HIGH DENSITY INTERCONNECTS

(71) Applicant: Intel Corporation, Santa Clara, CA (US)

(72) Inventors: Dheeraj Subbareddy, Portland, OR (US); Ankireddy Nalamalpu, Portland, OR (US); Md Altaf Hossain, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 369 days.

(21) Appl. No.: 16/023,724

(22) Filed: Jun. 29, 2018

(65) Prior Publication Data

US 2019/0042505 A1 Feb. 7, 2019

Related U.S. Application Data

(60) Provisional application No. 62/577,581, filed on Oct. 26, 2017.

(51) Int. Cl.
| | |
|---|---|
| *H01L 25/065* | (2006.01) |
| *G06F 13/42* | (2006.01) |
| *H01L 23/00* | (2006.01) |
| *G06F 13/38* | (2006.01) |
| *G06F 13/14* | (2006.01) |

(52) U.S. Cl.
CPC .............. *H01L 24/18* (2013.01); *G06F 13/14* (2013.01); *G06F 13/385* (2013.01); *G06F 13/4221* (2013.01); *G06F 13/4265* (2013.01); *H01L 25/0652* (2013.01); *H01L 25/0655* (2013.01)

(58) Field of Classification Search
CPC . H01L 24/18; H01L 25/0652; H01L 25/0655; G06F 13/14; G06F 13/4221; G06F 13/385; G06F 13/4265; Y02D 10/00
See application file for complete search history.

(56) References Cited

U.S. PATENT DOCUMENTS

2012/0221906 A1* 8/2012 Shetty .............. G01R 31/31727
714/727
2019/0131268 A1* 5/2019 Hossain ................. G06F 13/14

* cited by examiner

*Primary Examiner* — Idriss N Alrobaye
*Assistant Examiner* — Ronald T Modo

(57) ABSTRACT

An IC includes first, second, and third IOs, and a multiplexer that includes first and second inputs, and an output. The IC includes first and second transmitters respectively having an output coupled to the first IO and an output coupled to the second IO. A clock generator is coupled between the output and an input of the first transmitter and between the output and an input of the second transmitter. The first input may receive a clock signal generated by the first clock generator and the second clock input is coupled to the third IO and may receive a clock signal via the third IO element from another IC. An IC includes a programmable fabric, k*n wires coupled to and extending from the fabric, n TDMs, and n IO blocks. Each TDM includes k inputs coupled to k wires and an output coupled to one of the IO blocks.

15 Claims, 8 Drawing Sheets

INTERFACE BUS FOR INTER-DIE COMMUNICATION IN A MULTI-CHIP PACKAGE OVER HIGH DENSITY INTERCONNECTS

CROSS-REFERENCE TO RELATED APPLICATIONS

This application claims the benefit of U.S. provisional patent application 62/577,581, filed Oct. 26, 2017, which is incorporated by reference.

FIELD OF THE DISCLOSURE

The present disclosure relates to integrated circuit dies that are housed in a multi-chip package. More specifically, the present disclosure relates to a multi-chip package that houses homogeneous dies or heterogeneous dies where two or more of the dies share a clock signal.

BACKGROUND OF THE INVENTION

Integrated-circuit packaging has evolved from housing a single IC die in a package to housing and interconnecting a number of dies to form system-in-package (SiP) devices. SiP devices are often highly integrated semiconductors that may combine a number of IC dies of various functionalities, various processing generations, or various manufacturing processes, all within a single package. The IC dies combined in a SiP often form a system or subsystem for a device.

SiP devices not only reduce the footprint of IC dies housed in a single package as compared to discretely packaged ICs mounted on a printed circuit board (PCB) but also shorten the distances that electrical signals travel between IC dies housed by the SiP as compared to discretely packaged ICs mounted on a PCB.

Thereby, SiP devices may facilitate faster operations of a system or subsystem formed by the SiP device as compared to a system or subsystem of discretely packaged ICs mounted on a PCB. However, an impetus remains to continue to improve the operation of SiP devices and various embodiments described in this description are directed toward further improving the flexibility and the performance of SiP devices via a configurable clock system.

DETAILED DESCRIPTION OF THE INVENTION

System-in-package (SiP) devices, such as SiP devices that provide system and subsystem architectures, continue to fuel development in integrated circuit (IC) markets. Circuit emulation markets and data center markets are two of the developing IC markets fueled by SiP devices. SiP devices directed toward circuit emulation markets often include a number of configurable ICs to facilitate an almost unlimited number of emulated circuits where a single configurable circuit may be unable to supply sufficient programmable fabric for implementing a circuit emulation. SiP devices directed toward data center markets often include a number of configurable ICs to facilitate acceleration in the data center.

Configurable ICs included in these SiP devices may include field programmable gate arrays (FPGAs), programmable logic devices (PLDs), complex programmable logic devices (CPLDs), programmable logic arrays (PLAs), configurable logic arrays (CLAs), memory, transfer dies, and other ICs. Configurable ICs typically include a number of configurable logic blocks that can be configured to implement various circuits. The logic blocks are interconnected by configurable interconnect structures that can be configured to interconnect the logic blocks in almost any desired configuration to provide almost any desired circuit.

SiP devices that are directed toward circuit emulation markets, data center markets, and other markets are typically designed for two types of interconnect configurations. The two types of interconnections include a master-slave configuration and a peer-to-peer configuration. In a master-slave configuration, power and clock signals may be distributed from a master die to one or more other dies in the SiP. A master-slave configuration of die integration for power and clock distribution is often desired and used for integration of heterogeneous dies, such as heterogeneous high-speed input-output (HSIO) die integration (e.g., transceiver die). However, a master-slave configuration of die integration is typically not desired or used for homogeneous die integration. For die integration of homogeneous dies, typically a peer-to-peer die integration is desired and used. The limited perimeter space of SiPs limits the use of two separate sets of circuits for both master-slave die integration for heterogeneous dies and peer-to-peer die integration for homogeneous dies. Embodiments described in this description include a configurable die that has a configurable clock system and IO subsystem to facilitate master-slave integration of the die with heterogeneous dies and peer-to-peer integration of the die with homogeneous dies. The described embodiments are configurable for either heterogeneous or homogeneous die integration and consume limited perimeter space while allowing for these die integration schemes.

Figure 1:
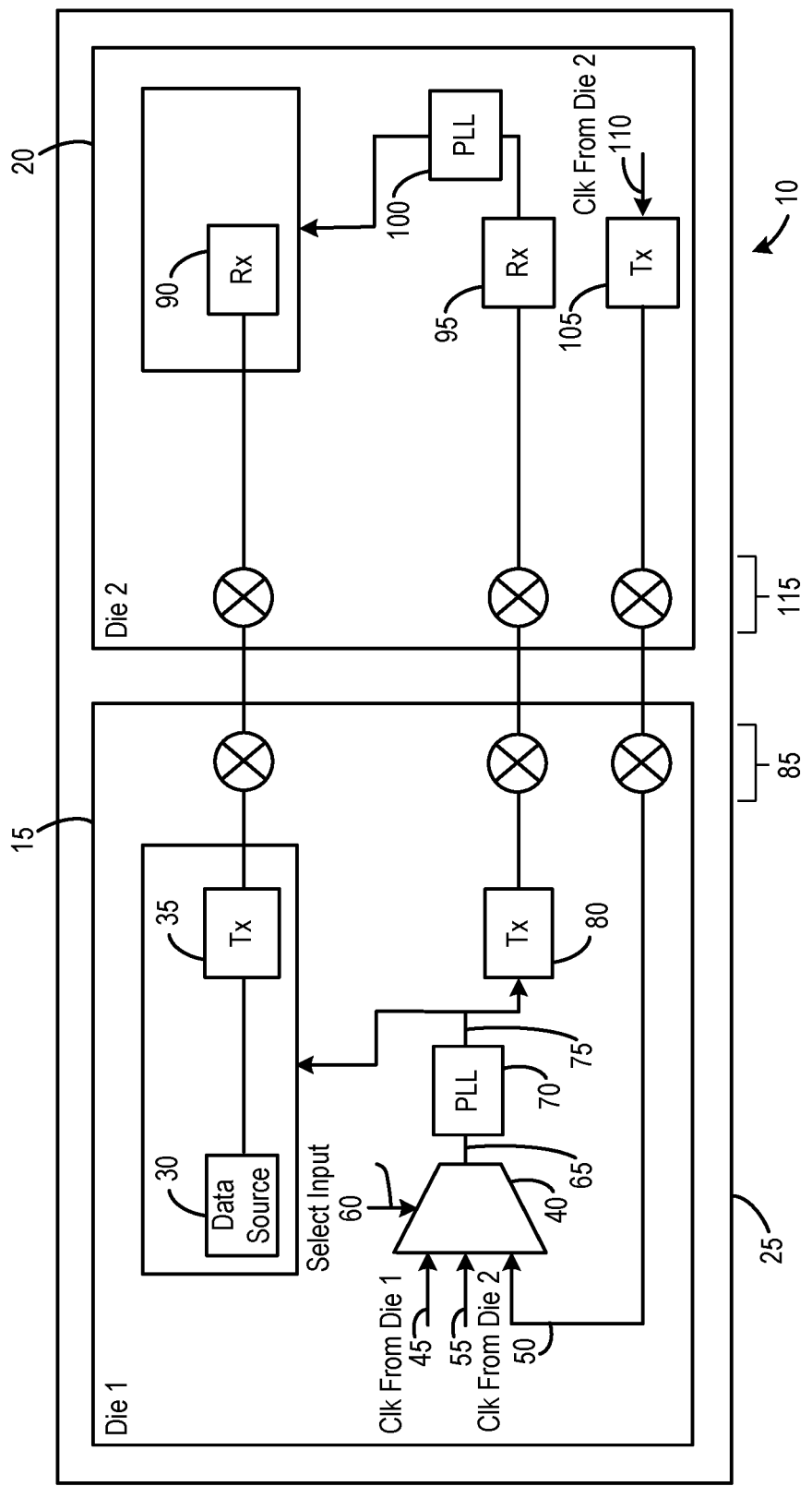
FIG. 1 illustrates a semiconductor device that includes at least a first die and a second die mounted on a package substrate of the device, in an embodiment.

FIG. 1 illustrates a semiconductor device 10 that includes a first die 15 and a second die 20 mounted on a package substrate 25 of the device, in an embodiment. The semiconductor device may include more than two dies in other embodiments. The first die 15 and the second die 20 may be the same types of dies or may be different types of dies. The first die may be a configurable logic die, such as a field programmable gate array (FPGA), a programmable logic device (PLD), a complex programmable logic device (CPLD), an electrically programmable logic device (EPLD), an electrically erasable programmable logic device (EE-PLD), a logic cell array (LCA), a programmable logic array (PLA), a configurable logic array (CLA), and other ICs. The second die may be an HSIO die (e.g., a transceiver die), a memory die, programmable logic integrated circuit, a programmable logic array (PAL), field programmable logic array (FPLA), a programmable logic device (PLD), a complex programmable logic device (CPLD), an electrically programmable logic device (EPLD), an electrically erasable programmable logic device (EEPLD), a logic cell array (LCA), an application-specific standard part (ASSP), a central processing unit (CPU), a microprocessor, a graphical processing unit (GPU), a digital signal processor (DSP), an application specific integrated circuit (ASIC), a vision processing unit (VPU), an image array processors (SIMD), a neural network processor, an artificial intelligence processor, a cryptographic accelerator, just to name a few.

The first die may be coupled to the second die via traces located in the package substrate. In one embodiment, the package substrate includes an interconnect bridge that couples the first and second dies via traces located in the bridge. The interconnect bridge may be a printed circuit board (e.g., an FR4 PCB), a silicon interposer, a chip on wafer on substrate (CoWos), an embedded multi-die interconnect bridge (EMIR) element, or another bridge type.

The first die includes a data source 30, a first transmitter 35, a multiplexer 40, a first clock generation circuit 70, and a second transmitter 80. The first die also includes a number of input-output (IO) elements 85, such as solder bumps, solder balls, pins, pads, or other interconnect elements, which are sometimes referred to generally as bumps. The IO elements are configured to connect with IO elements of other dies, such as the second die, via package substrate 25.

In an embodiment, one or more output lines of data source 30 are connected to inputs of first transmitter 35. The data source may include one or more configurable logic blocks of an FPGA die or another type of configurable device. The configurable logic blocks may be configured to implement various circuits. The logic blocks are interconnected by configurable interconnect structures that may be configured to interconnect the logic blocks in almost any desired configuration to provide almost any desired circuit.

An output of the first transmitter is adapted to transmit data out from the first die to the second die. Data output by the first transmitter may include data that the first transmitter receives from the data source.

Multiplexer 40 includes a number of input lines and an output line 65. The input lines include a first clock input line 45 and a second clock input line 50. The first clock input line 45 is for a clock signal local to the first die (e.g., generated by the first die) and the second clock input line 50 is for a clock signal that is transmitted from the second die (e.g., generated by the second die) to the first die. The multiplexer 40 may include one or more additional clock input lines, such as clock input line 55. The multiplexer includes a selector input that is connected to an input line 60 that selects one of the clock input lines for output from the multiplexer on output line 65, sometimes referred to as a clock output line. The clock output line of the multiplexer is connected to an input line of first clock generation circuit 70. The clock generation circuit may include a phase-locked loop (PLL) circuit.

First clock generation circuit 70 includes a clock output line 75 that is connected to the data source and the first transmitter. The clock output line 75 is also connected to a second transmitter 80. An output of the second transmitter circuit is adapted to transmit data out from the first die to the second die. Data output by the second transmitter may include a clock signal generated by the first clock generation circuit.

In an embodiment, first clock input line 45 is connected to first clock generation circuit 70. Specifically, a clock output line 75 of the first clock generation circuit is connected to first clock input line 45 and may transmit generated clock signals to the clock input line. In an alternative embodiment, clock output line 75 and the first clock generation circuit are not connected to first clock input line 45 and a different clock generation circuit (e.g., a different PLL) of the first die is connected to first clock input line 45. The clock output line 75 of first clock generation circuit 70 may be connected to first clock input line 45 by a first in, first out (FIFO) circuit, a cross-connect circuit, a combination of these circuits, or other circuits. The use of one or more of these connect circuits provides that clock contention is avoided in the die.

Clock signals transmitted from the first clock generation circuit 70 to the data source 30 and to first transmitter 35 are used by the logic blocks of the data source for clocking data to the first transmitter. The clock signals are also used by the first transmitter to clock and transmit the received data from the first die to the second die via one or more of the IO elements 85 of the first die, one or more IO elements 115 of the second die, and via traces of the package substrate 25 that connect with the IO elements.

In an embodiment, the second die includes a first receiver 90, a second receiver 95, a second clock generation circuit 100 (e.g., a PLL), a third transmitter 105, and a clock input line 110. The clock input line 110 connects to an input line of the third transmitter 105. The second die also includes a number of input-output (TO) elements 115, such as solder bumps, solder balls, pins, pads, or other interconnect elements, which are sometimes referred to generally as bumps. The IO elements are configured to connect with IO elements of other dies, such as the first die, via package substrate 25.

In an embodiment, a data input line of first receiver 90 in second die 20 is connected to the data output line of the first transmitter circuit 35 of the first die 15 via one or more of first and second IO elements 85 and 115 and via package substrate 25. The data input line of the second receiver 95 in the second die is connected to a data output line of the second transmitter 80 in the first die. Clock signals transmitted from the data output line of the second transmitter 80 in the first die are transmitted through the second receiver 95 of the second die to the input line of the second clock generation circuit 100. The second clock generation circuit 100 uses the clock signals transmitted from the first die 15 to the second receiver 95 of the second die 20 for generating clock signals used in the second die. The clock signals that are generated by the second clock generation circuit 100 are transmitted to the first receiver 90 for clocking received data (e.g., received from the first die) through the second receiver circuit and into the second die.

In an embodiment, an output line of the third transmitter 105 in the second die 20 is connected to the second clock input line 50 of the multiplexer 40 in the first die 15 via one or more of the IO elements 85 and 115 and via the package substrate 25. The clock input line 110 of the third transmitter 105 is connected to second clock generation circuit 100 of the second die 20.

In a first peer-to-peer mode of operation of the semiconductor device, the first die operates as a transmitting die and the second die operates as a receiving die where the first die controls the transmission of data from the first die to the second die. Both a clock signal from the first die and data from the first die are transmitted to the second die where the second die uses the clock signal from the first die to clock data received from the first die into the second die. In a second peer-to-peer mode of operation of the semiconductor device, the second die is configured similarly to the first die in the example described immediately above. The second die operates as a transmitting die and the first die operates as a receiving die where the second die controls the transmission of data from the second die to the first die and transmits a clock signal to the first die where the first die uses the clock signal from the second die to clock data received from the second die into the first die.

For the first peer-to-peer mode of operation of the semiconductor device, input line 60 to the multiplexer 40 selects first clock input line 45 for connection to output line 65 of the multiplexer. Signals transmitted from first clock input line 45 to output line 65 are further transmitted to the first clock generation circuit 70. The first clock generation circuit 70 uses the received signal to generate a clock signal. The generated clock signal is used by semiconductor device 10 for clocking the first and second dies.

Additionally, for the first peer-to-peer mode of operation of the semiconductor device, the clock signal generated by the first clock generation circuit 70 is transmitted to the first transmitter circuit 35 for clocking data received from the data source to the second die. The clock signal may also be used by the data source for various clocking purposes. The clock signal is also transmitted by the second transmitter 80 of the first die to the second receiver 95 of the second die.

The second clock generation circuit 100 of the second die may use the received clock signal for clock generation. Clock signals generated by the second clock generation circuit may be used by the second die for clocking the data received from the first transmitter circuit 35 into the second die using the first receiver 90. In the first peer-to-peer mode of operation, the clock signal received by the second die from the first die may be used by the second die for other clocking purposes. In other embodiments, in the first peer-to-peer mode of operation, the clock signal received by the second die from the first die is not used by the second die for other clocking purposes.

Figure 2:
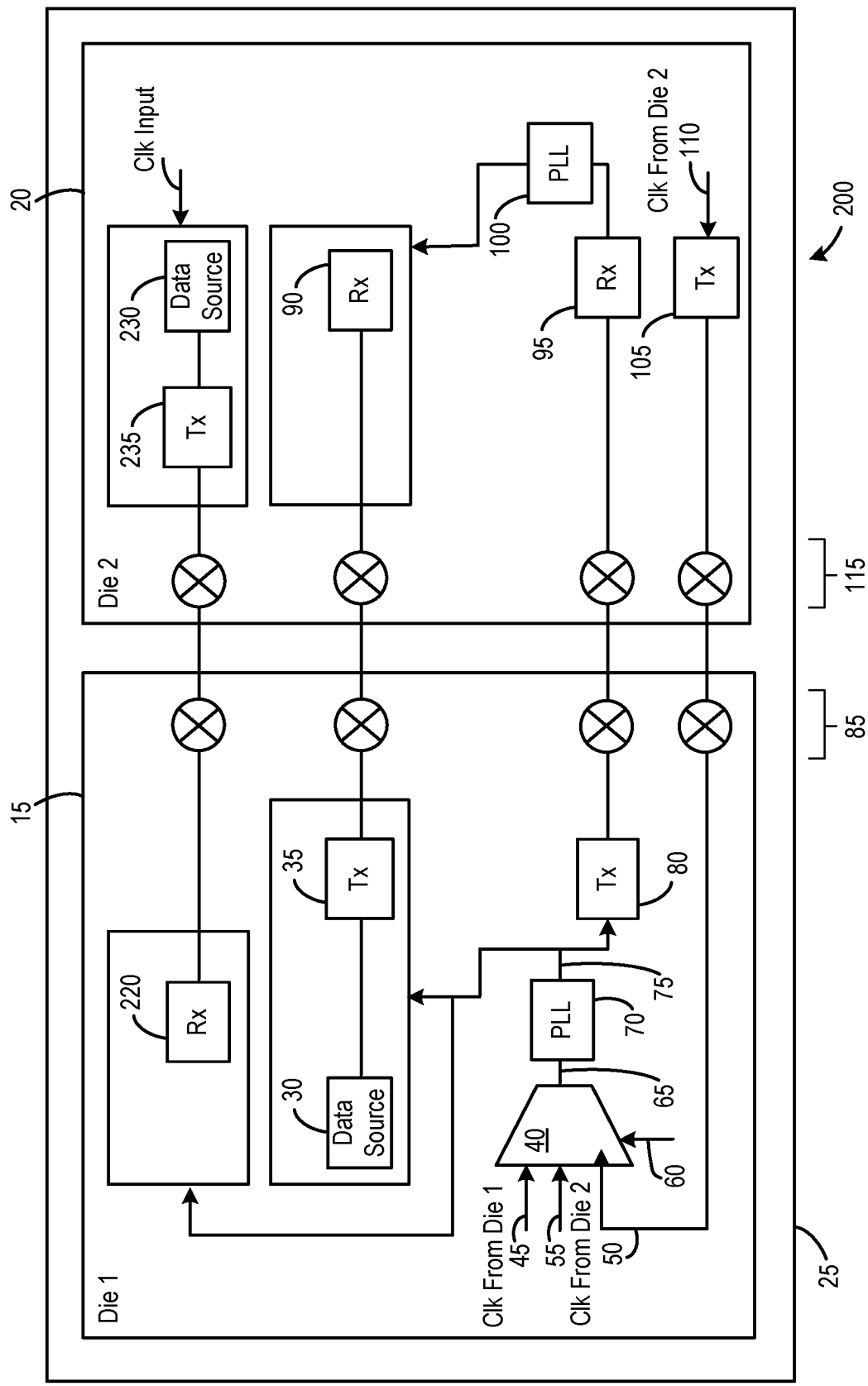
FIG. 2 illustrates a semiconductor device having two dies using an interconnect, in an embodiment.

FIG. 2 illustrates a semiconductor device 200 where the first die 15 includes a third receiver circuit 220 connected to the first clock generator circuit and the second die 20 includes a data source 230 and a fourth transmitter circuit 235 coupled to the data source 230, in an embodiment. Clock signals transmitted from the first clock generation circuit to the third receiver may be used by the third receiver circuit to clock data received from the second die into the first die. The fourth transmitter may use the clock signal received by the second die from the first die for clocking the data to the third receiver circuit of the first die.

In a second peer-to-peer mode of operation of the semiconductor device, the second die operates as a transmitting die and the first die operates as a receiving die where the second die controls the transmission of data from the second die to the first die. That is, the second die may be similarly configured to the first die (e.g., include a multiplexer) for transmitting clock signal generated in the second die to the first die for use in the first die for clocking data to the second die and for clocking data from the second die to the first die where the first die uses the received clock signal for clocking the received data into the first die.

In a master-slave mode of operation of the semiconductor device, the second die controls the transmission of data from the first die to the second die. That is, the second clock generation circuit 100 of the second die generates clock signals and transmits the clock signals to the first die. The first die uses the clock signals to transmit data back to the second die and the second die uses the clock signal to clock the data into the second die. For a first die that also includes a receiver circuit 220 (e.g., of semiconductor device 200), the clock signals received from the second die may be used by the first die to clock the receiver circuit for clocking data from the second die into the first die.

Specifically, the second die is adapted to generate a clock signal and transfer the clock signal to the clock input line 110 of the third transmitter 105 of the second die. The third transmitter 105 transmits the clock signal generated by the second die to the first die where the clock signal is routed to second clock input line 50 of the multiplexer. The clock signal generated in the second die and transmitted to the first die may be generated by second clock generation circuit 100.

The clock signal received at second clock input line 50 is transmitted through the multiplexer to clock output line 65. The signal output from clock output line 65 is transmitted to first clock generation circuit 70. The first clock generator generates a clock signal using the received signal and transmits the generated clock signal to the first transmitter 35. The clock signal is used by the first transmitter 35 to clock data from data source 30 to the first receiver 90 of the second die. The clock signal generated by the second die may be used by the first receiver 90 of the second die to clock the data transmitted from the first transmitter circuit 35 of the first die into the second die. Thereby, the second die is adapted to control the transmission of data in the first die to the second die via the transmission of a clock signal generated in the second die to the first die.

Figure 3:
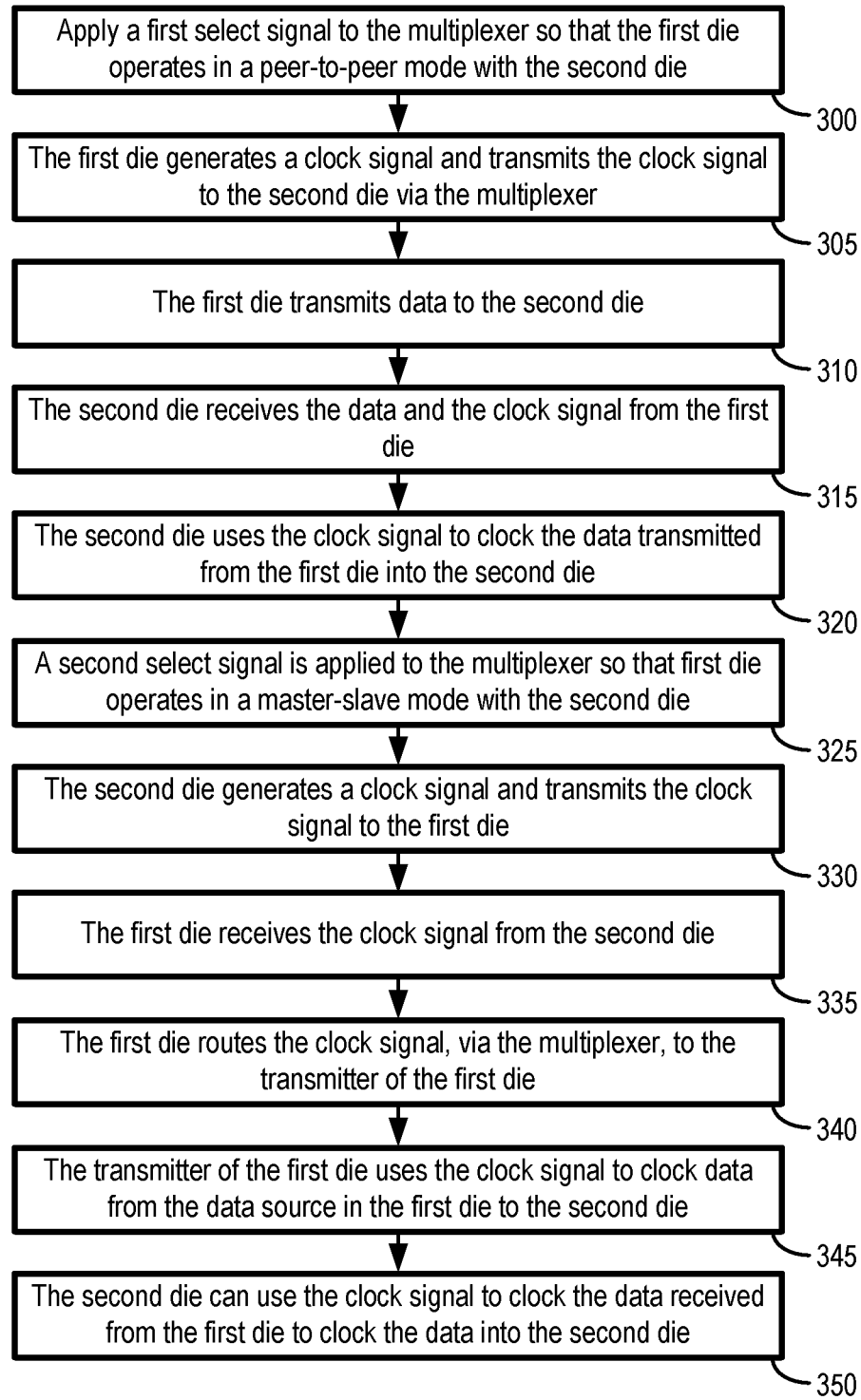
FIG. 3 is a flow diagram of a method of operation of a semiconductor device, such as a SiP, where the dies of the SiP are configurable for operating in a peer-to-peer mode of operation or for operating in a master-slave mode of operation, in an embodiment.

FIG. 3 is a flow diagram of a method of operation of a semiconductor device that includes at least two dies, such at least two die of a SiP, in an embodiment. At least a first die is configurable for operating in a peer-to-peer mode of operation with at least a second die of the SiP and the first die is alternatively configurable for operating in a master-slave mode of operation with the second die. In the peer-to-peer mode of operation, the first and second die may be the same types of dies, such as two FPGAs. In the master-slave mode of operation, the first and second dies may be different types of dies, such as an ASIC and an FPGA, a processor and an FPGA, or other die combinations. The high-level flow diagram represents one example embodiment. Steps may be added to, removed from, or combined in the flow diagram without deviating from the scope of the embodiment.

At 300, a first select signal is applied to the selector input of the multiplexer so that the first die operates in a peer-to-peer mode with the second die. In the peer-to-peer mode of operation, the first die operates as a transmitting die and the second die operates as a receiving die where the first die controls the transmission of data from the first die to the second die.

At 305, in the peer-to-peer mode, the first die generates a clock signal and transmits the clock signal to the second die via the multiplexer.

At 310, in the peer-to-peer mode, the first die transmits data to the second die. The first die may use the clock signal generated by the first die to clock the data from the first die to the second die.

At 315, in the peer-to-peer mode, the second die receives the data and the clock signal from the first die.

At 320, in the peer-to-peer mode, the second die uses the clock signal to clock the data transmitted from the first die into the second die. The second die may not use the clock signal received from the first die for other clocking purposes in the second die.

At 325, a second select signal is applied to the selector input of the multiplexer so that first die operates in a master-slave mode with the second die where the second die is the master and the first die is the slave. That is, the second die, via a clock signal generated by the second die, controls the first die to transmit data to the second die under control of the second die's clock signal. When the second select signal is applied to the multiplexer, the first signal is not applied to the multiplexer.

At 330, in the master-slave mode, the second die generates a clock signal and transmits the clock signal to the first die.

At 335, in the master-slave mode, the first die receives the clock signal from the second die.

At 340, in the master-slave mode, the first die routes the clock signal, via the multiplexer, to the transmitter of the first die.

At 345, in the master-slave mode, the transmitter of the first die uses the clock signal to clock the data from the data source in the first die to the second die. That is, the clock signal generated by the second die and transmitted to the first die controls the first die to clock data to the second die.

At 350, in the master-slave mode, the second die may use the clock signal to clock the data received from the first die to clock the data into the second die.

While the foregoing description describes the second die operating as the master die and the first die operating as the slave die, in an alternative embodiment, the first die is adapted to operate at the master die and the second die is adapted to operate as the slave die. The second die may include a multiplexer 40, which is configurable for using a clock generated by the first die for use by the second die for clocking data from the second die to the first die.

The ability to alternatively configure dies for operation either a master-slave mode of operation or a peer-to-peer mode of operation allows for a number of benefits. Specifically, the ability to connect dies alternatively in a master-slave mode or a peer-to-peer mode programmatically allows for the relatively efficient use of the limited bumps and limited perimeter space of the dies and thereby allows for the flexibility in late-binding integration of multi-die in SiPs by manufacturers of the SiPs. Late binding allows for the customization of SiP product offerings relatively late in the product development cycle of the SiPs for time-to-market benefits for both manufacturers of the SiPs and users of the SiPs. Thereby, providing multiple varieties of a die with either master-slave circuity or peer-to-peer circuitry can be avoided. Also, providing dies with different circuits for master-slave mode and a peer-to-peer mode can also be avoided as the different circuits would consume more perimeter space than the described embodiments.

That is, a configurable die may be packaged in a SiP with either a homogenous die or a heterogeneous die based on the die configurability and without having to provide two different die types for peer-to-peer mode and master-slave mode where the two different die types are essentially the same but differ for peer-to-peer and master-slave operations.

The ability to alternatively configure dies for either a master-slave mode of operation or a peer-to-peer mode of operation allows for additional benefits. Specifically, by utilizing the same die perimeters to integrate both homogeneous and heterogeneous dies, the SiPs make efficient use of the limited perimeter length available particularly in smaller dies. More specifically, die perimeter is not consumed with two different dies interconnect circuits for peer-to-peer and master-slave operations.

Figure 4:
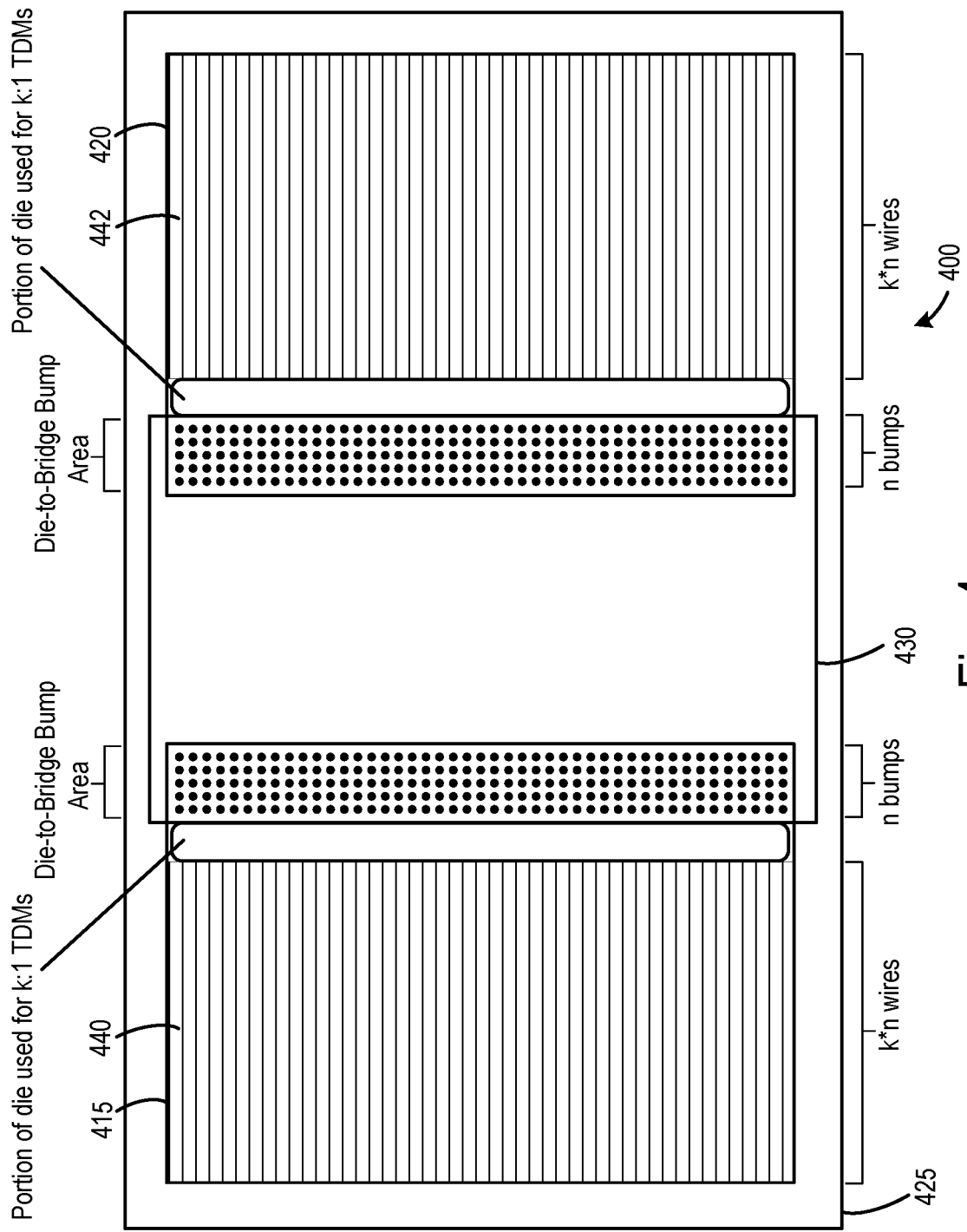
FIG. 4 illustrates a layout of a semiconductor device, in an embodiment.
Figure 5:
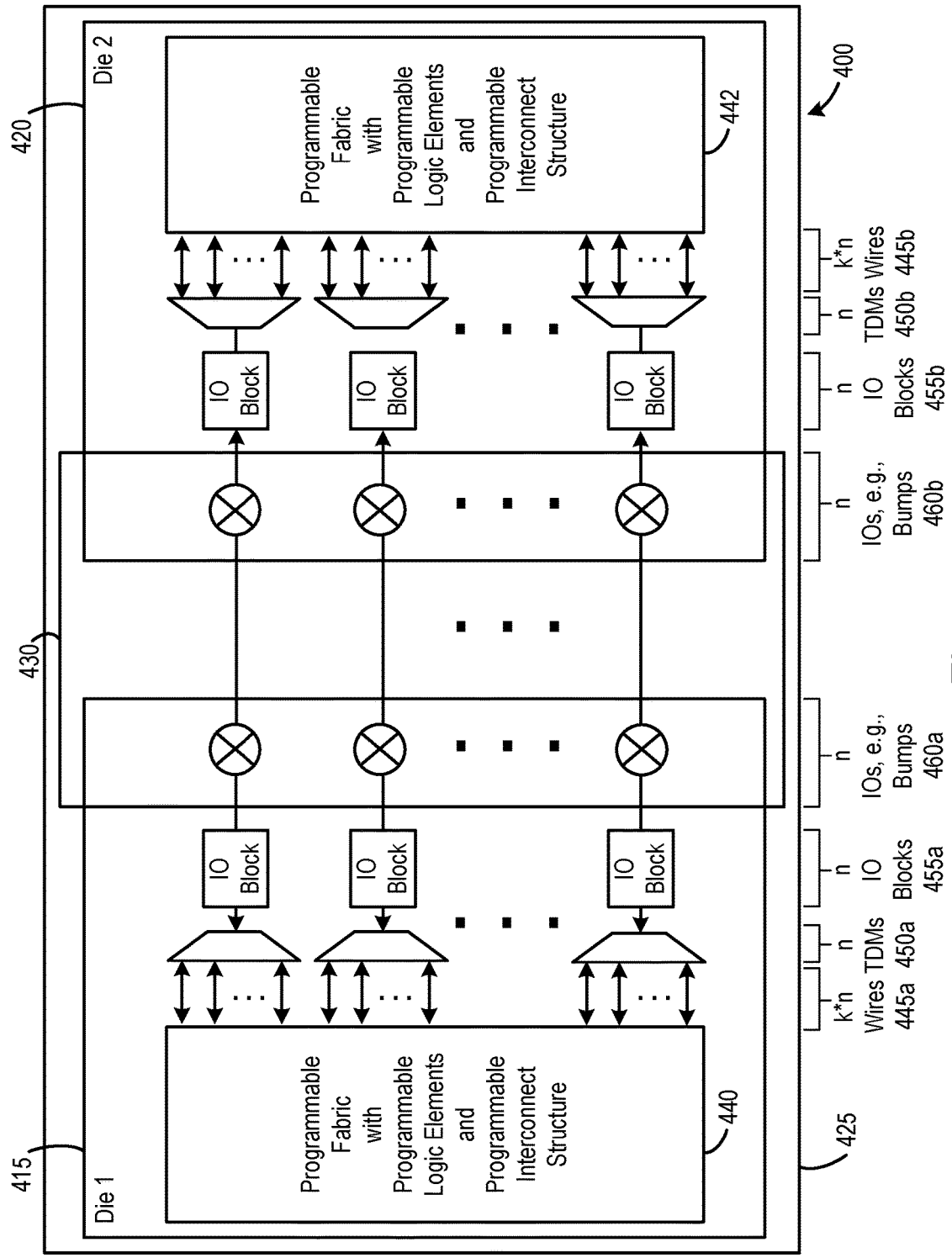
FIG. 5 illustrates various circuit elements included in the semiconductor device shown in FIG. 4, in an embodiment.

FIGS. 4 and 5 illustrate a semiconductor device 400 that includes a first die 415 and a second die 420 mounted on a package substrate 425. FIG. 4 is a block diagram that illustrates a general layout of the semiconductor device and FIG. 5 is a block diagram that illustrates various circuit elements of the device. The semiconductor device may include more than two dies on the package substrate and may be a SiP or other type of multi-chip device.

In an embodiment, the package substrate includes an interconnect bridge 430, such as an EMIB element, that connects the IO elements (e.g., bumps) first and second dies. The semiconductor device may include more interconnect bridges to connect other dies that may be included in the device. In another embodiment, the interconnect bridge is an interposer. The interposer may be a silicon interposer for a 2D, 2.5D, or 3D IC package. The interposer may be an extended silicon interposer that extends under first and second dies 415 and 420 and may connect to additional dies that may be connected to die 415, 420, or both. For a 2D package, the interposer is interposed between the dies and may be a PCB (e.g., FR4 PCB). The interposer for a 2D package is sometimes referred to as a SiP substrate where a first side of the interposer is connected to the dies via solder bumps of a first size (e.g., about 100 microns in diameter or other diameters) and a second side of the interposer is connected to the PCB by solder bumps of second larger size (e.g., larger diameter) than the first size. The smaller solder bumps are sometimes referred to as flip-chip bumps and the larger diameter solder bumps are sometimes referred to as package bumps. For a 2.5D package, the interposer is interposed between the dies and a SiP substrate where the interposer includes vias that connect the dies to the SiP substrate. The SiP substrate is in turn connected to a PCB (e.g., FR4 PCB). The interposer for a 2.5D package is connected to the dies via relatively small solder bumps that are sometimes referred to as micro-bumps (e.g., about 10 microns in diameter or other diameters) and a second side of the interposer is connected to the SiP by solder bumps of larger diameter, such as about 100 microns in diameter or other diameters.

The first and second dies may be first and second configurable ICs, such as first and second FPGAs. The first die includes a first programmable fabric 440 and the second die includes a second programmable fabric 442. Each programmable fabric includes a number of configurable logic blocks and a configurable interconnect structure. First programmable fabric 440 includes a number of wires 445*a* that may form a portion of the configurable interconnect structure that programmatically interconnects the configurable logic blocks of first programmable fabric 440. Second programmable fabric 442 includes a number of wires 445*b* that may form a portion of the configurable interconnect structure that programmatically interconnects the configurable logic blocks of second programmable fabric 442.

All or a portion of wires 445*a* of the first die extend from the programmable fabric of the first die to IO block 455*a* of the first die. All or a portion of wires 445*b* of the second die extend from the programmable fabric of the second die to IO block 455*b* of the second die. The IO blocks are sometimes referred to as interconnect buses or as die-to-die perimeter edges as the IO blocks are adjacent to the bump regions of the respective dies.

The number of wires (e.g., t=k*n number of wires) that extend from first programmable fabric 440 of the first die to IO blocks 455a of the first die exceeds the number of IO blocks 455a (e.g., n number of IO blocks) of the first die and exceeds the number of IO elements 460a (e.g., n number of bumps) in the bump out region of the first die. Similarly, the number of wires (e.g., t=k*n number of wires) that extend from second programmable fabric 442 of the second die to IO blocks 455b of the second die exceeds the number of IO blocks 455b (e.g., n number of IO blocks) of the second die and exceeds the number of IO elements 460b (e.g., n number of bumps) in the bump out region of the second die.

The first die includes a number (e.g., n number) of time division multiplexers (TDMs) 450a, which are located outside of first programmable fabric 440 of the first die, and the second die includes a number (e.g., n number) of TDMs 450b of the second die, which are located outside of second programmable fabric 442 of the second die. Each TDM of the first die includes an output, which is connected to the inputs of one or more of the IO blocks of the first die, and each TDM of the second die includes an output, which is connected to the inputs of one or more of the IO blocks of the second die.

Each TDM of the first die has a number of inputs (e.g., k number of inputs) and each input is connected to one of the wires, which extends from first programmable fabric 440. In a specific embodiment, each wire is connected to one of the TDMs and is not connected to a second one of the TDMs. Thereby, signals on k wires connected to one of the TDMs 450a may be time multiplexed to one of the IO elements 460b (e.g., one of the bump) via the TDM and the IO block that the TDM is connected to. In an embodiment, each TDM of the first die is adapted to operate as a demultiplexer where signals received by the TDM from one of the IO blocks may be time demultiplexed onto the wires and into the programmable fabric.

Each TDM of the second die has a number of inputs (e.g., k number of inputs) and each input is connected to one of the wires, which extends from second programmable fabric 442. In a specific embodiment, each wire is connected to one of the TDMs and is not connected to a second one of the TDMs. Thereby, signals on k wires connected to one of the TDMs 450b may be time multiplexed to one of the IO elements 460b (e.g., one of the bump) via the TDM and the IO block that the TDM is connected to. In an embodiment, each TDM of the second die is adapted to operate as a demultiplexer where signals received by the TDM from one of the IO blocks may be time demultiplexed onto the wires and into the programmable fabric.

During operation of the semiconductor circuit, t signals (k*n signal) on the t wires of the first die may be time multiplexed (e.g., concentrated) into a fewer number of IO elements 460a (e.g., n IOs) and transmitted to the IO elements 460b of the second die via the interconnect bridge where the n concentrated signals in the second die may be time demultiplexed (e.g., unconcentrated) by the TDM of the second die into t signals (k*n signal) and transmitted to the programmable fabric of the second die. In other embodiments, the second die is the transmitter die and the first die is the receiving die and the time multiplexing occurs in the second die and the time demultiplexing occurs in the first die.

In an embodiment, each of the TDMs of the first and second dies is a hardwired circuit in the silicon substrates of the respective dies. That is, each TDM is not configured in the programmable fabric of the respective dies. Thereby, the programmable fabrics of the dies are not consumed by the TDMs and are available for other configurable circuitry. The TDMs of the first die may be formed in a portion of the silicon substrate of the first die that does not include (i.e., is outside) the programmable fabric of the die. Also, the TDMs of the second die may be formed in a portion of the silicon substrate of the second die that does not include (i.e., is outside) the programmable fabric of the die.

Figure 6:
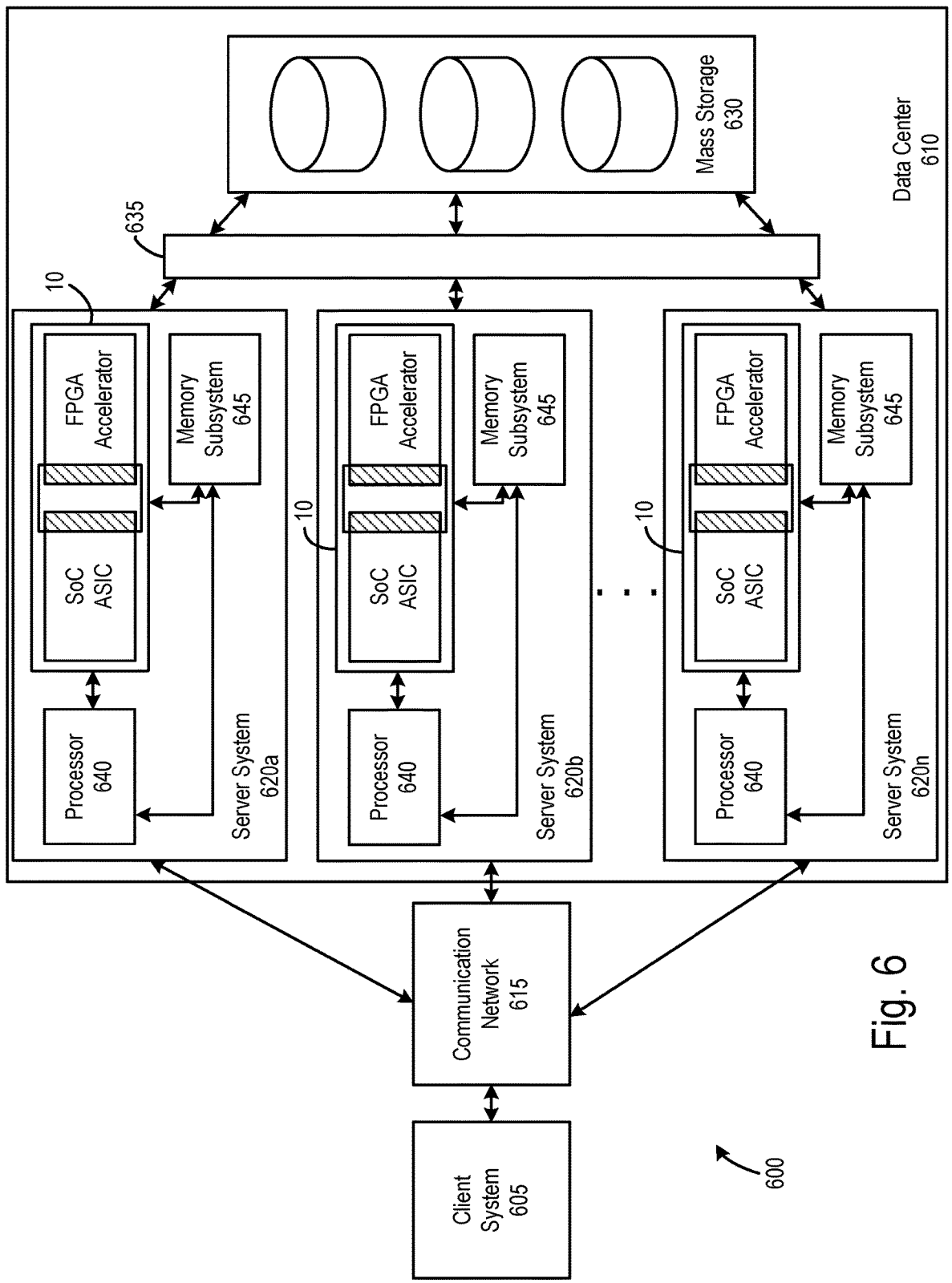
FIG. 6 illustrates a data center system that includes one of the described semiconductor devices, in an embodiment.

FIG. 6 illustrates a data system 600, in an embodiment. Data system 600 includes a client system 605 that is adapted to access a data center 610 using a communication network 615. The client system 605 may include one or more client computers that are adapted to access data stored in the data center. The client system may include a server, a desktop computer, a laptop computer, a mobile device (e.g., a tablet computer, a smartphone, or other devices), any combination of these devices, or other devices. The client system may transfer data to the data center for storage in the data center, retrieve data from the data center, or request alteration of data in the data center. Communication network 615 may include one or more networks, such as the Internet, one or more intranets, or other network systems.

Data center 610 includes one or more servers, such as servers 620a, 620b . . . 620n, mass storage 630, an IP switch 635, and may include other elements. Mass storage 630 includes one or more types of memory devices, such as a disk array that includes a number of disk memory devices (e.g., magnetic disk memory), optical storage (e.g., optical disk storage), solid state memory, tape memory, and others. The memory devices may be located in one or more data center racks, which include one or more of the servers, the IP switch, both, or do not include the servers and the IP switch. The IP switch routes communication packets between the servers and the memory devices of the mass storage.

Each server includes one or more processors 640, one or more semiconductor devices 10, 200, and 400 (described above), a memory subsystem 645, and other devices. In each server, a first processor 640 included in the server may communicate with a second processor 640 in the server using a bus structure and a bus communication standard, such as the UltraPath Interconnect (UPI) standard for point-to-point processor interconnect or may use a different communication standard. The processor and semiconductor device of a server may communicate using a bus structure and a bus communication standard, such as the peripheral component interconnect express (PCIe) standard. The processor, semiconductor device, or both may communicate with the memory subsystem at a single data rate (SDR), double data rate (DDR), or quad data rate (QDR) in half or full duplex mode. The memory subsystem may include DDR non-volatile memory, 3D xPoint non-volatile memory, or other types of memory.

In an embodiment, each semiconductor device (e.g., semiconductor device 10, 200, or 400 described above) is located on a PCB (e.g., a PCI card) where the PCB is configured to be inserted and held in a PCI or PCIe slot of a server. In some embodiments, one or more servers include a number of semiconductor devices 10, 200, or 400, which may be positioned a number of PCB cards that are located in a server's PCI or PCIe slots.

In each server, the processor, semiconductor device, and memory subsystem are located on a single sled in a data center rack, are distributed among two or more sleds in a data center rack, or are distributed among a number of sleds in a number of data center racks. That is, each server is a consolidated server (e.g., components in a single sled and in a single data center rack) or a distributed server (e.g., components in multiple sleds in a single data center rack, or components in multiple sleds and in multiple data center racks). Distributing components of a server among sleds, data center racks, or both may facilitate relatively fast communication between the components by positioning select components in frequent communication relatively close to each other. For example, in a server where the processor accesses the memory subsystem more frequency than the semiconductor device, the processor and memory subsystem may be located relatively close (e.g., on a first sled) in a data center rack and the semiconductor device may be located farther from the memory subsystem (e.g., on a different second sled) in the data center rack. Alternatively, the second sled may be positioned nearer the mass storage than the first sled, for example, if the semiconductor device accesses the mass storage with a higher frequency than the processor.

In an embodiment, the memory subsystems of a number of servers may be located on a single sled (e.g., a sled that is located at about the center of a data center rack) and the processors and semiconductor devices may be located on one or more different sleds located above and below the center sled. Such configuration may facilitate relatively fast access to the memory subsystem particularly if the memory subsystems are accessed by multiple servers.

In the data center, an FPGA of the semiconductor device in combination with one or more other devices (e.g., another FPGA, an ASIC, a processor, or another device) on the semiconductor device facilitate the acceleration one or more functions that may be offloaded from a processor 640 to the FPGA. For example, the FPGA operating as an accelerator may be configured to perform massively parallel, real-time processing functions that may be offloaded from the processor to the FPGA and performed faster than the processor. Example massively parallel, real-time processing functions include massively parallel, real-time data checking, data conversion, data processing, video processing, frame grabbing, image enhancement of grabbed frames, erosion filtering, dilation filtering, encryption, decryption, data extraction from a long word, or other functions performed on relatively small portions of data that can be operated on in parallel at higher rates of operation compared to the processor.

A combination of benefits is provided in the data center due to a configurable IC (e.g., an FPGA) of the semiconductor device (e.g., 10, 200, or 400) being configurable for operation with either homogeneous or heterogeneous devices in a peer-to-peer mode or a master-slave mode on the semiconductor device. For example, one benefit includes coupling a configurable IC with a processor, ASIC, or another heterogeneous device in a master-slave mode in the semiconductor device when additional processing is desired in combination with the configurable IC in the data center. Another example benefit includes coupling multiple configurable ICs (e.g., multiple FPGAs) on the semiconductor device in a peer-to-peer mode when additional acceleration is desired in the data center. These benefits are achieved via the single configurable clock structure of the configurable IC described. That is, two different types (e.g., different flavors of the same device) of configurable ICs that operate exclusively in a peer-to-peer mode (i.e., first device type) or master-slave mode (e.g., second device type) do not need to be used to achieve the benefits of the single configurable IC described. Further, a configurable IC that includes two independent sets of circuits that operate in a peer-to-peer mode and a master-slave mode, and which take up relatively large amounts of perimeters space do not need to be used to achieve benefits of the single configurable IC described.

Figure 7:
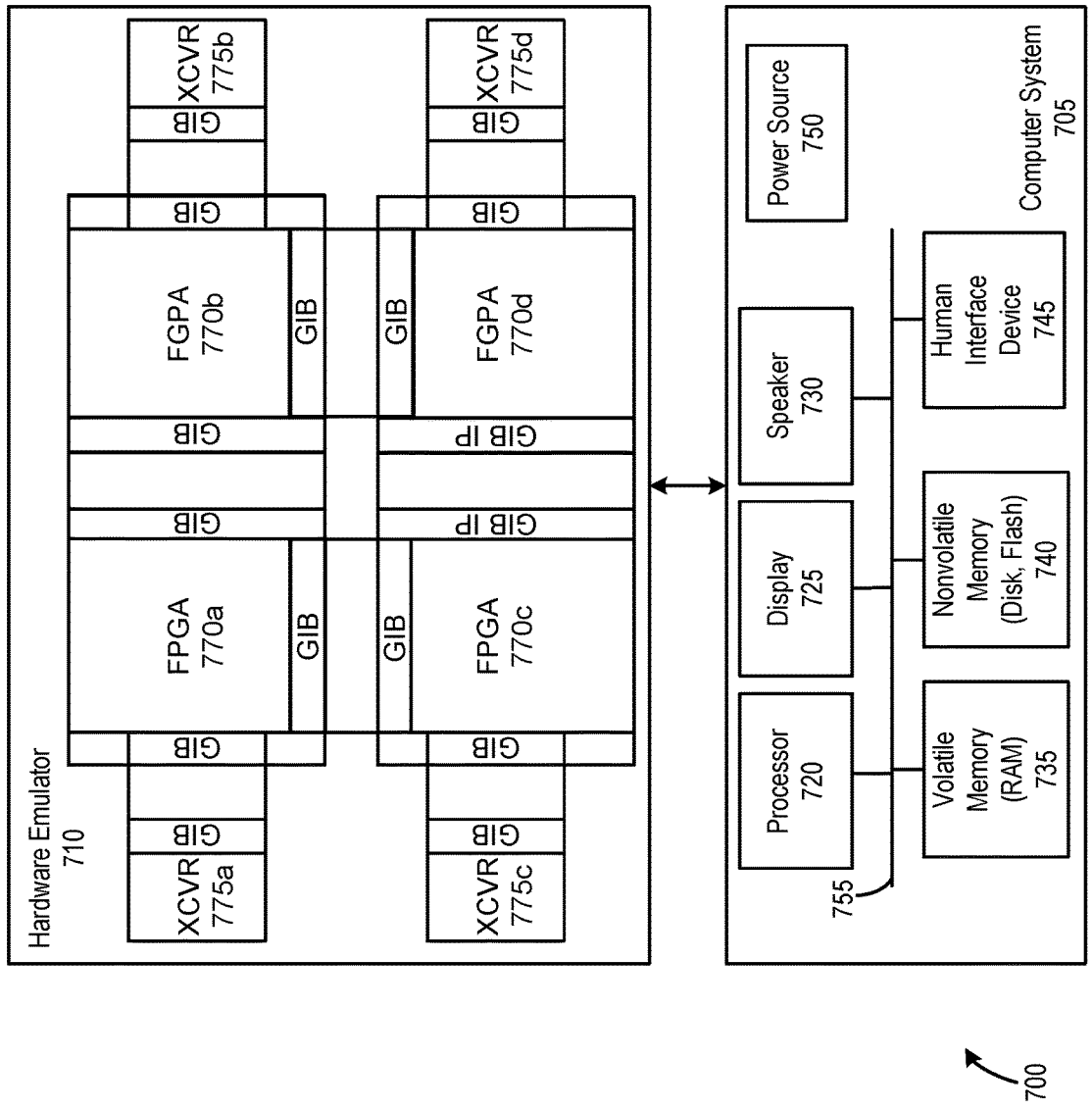
FIG. 7 illustrates an emulation system that includes a computer system and a hardware emulator, in an embodiment.

FIG. 7 illustrates an emulation system 700 that includes a computer system 705 and a hardware emulator 710, which may include one or more semiconductor devices, such as devices 10, 200, or 400 in any combination. The hardware emulator is an emulator that takes the form of a hardware device that emulates another device. The hardware emulator, for example, may emulate an electronic device, such as a printer, a scanner, a camera, a one or more types of processors, a computer, a game console, a tablet computer, a smartphone, a television, a medical device, an electronic system of a vehicle (e.g., car, airplane, motorcycle, or others), a home appliance, a meter, such as a gas meter, a router, or other devices.

The computer system 705 may be a personal computer, a laptop computer, a server, a tablet computer, a custom computer system, such as a custom computer system adapted for testing the emulator, or other computer types. The computer system may include a processor 720, a display 725, a speaker 730, a volatile memory 735, a nonvolatile memory 740, a human interface device 745, a power source 750, one or more busses 755 that link the components, any combination of these components, or other additional components. The computer system may link to the hardware emulator via a wired or a wireless communication link. The wired communication link may include, for example, one or more of USB, Ethernet, serial RS-232, parallel DB25, eSATA, displayport, HDMI, an optical link, PCI, PCIe, or others. The wireless communication link may include, for example, one or more of an RF link (e.g., Bluetooth, Wi-Fi, or others), an IR link, or others.

The hardware emulator may include one or more configurable IC, such as FPGAs 770a, 770b, 770c, and 770d, one or more transceivers (i.e., XCVRs), such as transceivers 775a, 775b, 775c, and 775d, and one or more general interface bridges (i.e., GIBs) or other bridge types (e.g., EMIBs). The FPGAs and transceivers may be communicatively linked by the bridges. The hardware emulator may include other circuits, such as a processor, memory, a network interface device, a USB hub and port, a PCIe connector, a complex programmable logic device (CPLD), an ASIC, or any combination of these devices. The circuits (e.g., FPGA, ASIC, processor, or others described above) of the hardware emulator may form a portion the circuits one or more semiconductor devices 10, 200, or 400 described above. The circuits of the hardware emulator (e.g., FPGAs or other circuits) may be configured to operate either in a peer-to-peer mode or a master-slave mode as described above. For example, two or more FPGAs may operate in a peer-to-peer mode and other FPGAs may operate in a master-slave mode, for example, if the FPGAs are different types or are from different processing generations.

One or more of the FPGAs are configurable for emulating one or more devices, such as the emulated devices listed above. The FPGAs may be configured to emulate a device using a hardware description language, such as HDL, to configure the logic array block of the FPGA.

A variety of benefits are provided in hardware emulators due to the FPGAs being configurable for operation with either homogeneous or heterogeneous devices in a peer-to-peer mode or a master-slave mode on the semiconductor device. The benefits provided are similar to those described above with respect to the data center benefits.

In an embodiment, a semiconductor device includes a first configurable integrated circuit (IC), which includes first, second, and third IO elements. The first configurable IC may include a multiplexer, which includes a first clock input, a second clock input, a clock output, and a selector input. The second clock input may be coupled to the third IO element and is adapted to receive a clock signal via the third IO element.

The first configurable IC may include a first transmitter having an output where the output is coupled to the first IO element and may include a second transmitter having an output where the output of the second transmitter is coupled to the second IO element.

The first configurable IC may include a first clock generator coupled between the clock output of the multiplexer and a clock input of the first transmitter and between the clock output of the multiplexer and a clock input of the second transmitter. The first clock input of the multiplexer may be adapted to receive a clock signal generated by the first clock generator.

In an embodiment, the semiconductor device may include a package substrate where the first configurable IC is mounted on the package substrate and may include a second configurable IC, which is mounted on the package substrate. The second configurable IC may include a fourth IO element coupled to the first IO element of the first configurable IC via the package substrate and may include a fifth IO element coupled to the second IO element of the first configurable IC via the package substrate.

The second configurable IC may include a first receiver having an input where the input of the first receiver is coupled to the fourth IO element. The second configurable IC may include a second receiver having a first input where the first input of the second receiver may be coupled to the fifth IO element. The second configurable IC may include a second clock generator coupled between an output of the first receiver and a second input of the second receiver.

The second clock generator may be adapted to receive a first signal via the second receiver from an output of the second transmitter, generate a clock signal using the first signal, and transmit the clock signal generated by the second clock generator to the second input of the second receiver.

The second configurable IC may include a sixth IO element coupled to the third IO element of the first configurable IC via the package substrate. The second configurable IC may include a third transmitter having an input and an output where the input of the third transmitter is adapted to receive a clock signal generated by the second clock generator and the output of the third transmitter is coupled to the sixth IO element.

The first and second configurable ICs may operate in a peer-to-peer mode if the first clock input is selected by the selector input of the multiplexer, and the first and second configurable ICs may operate in a master-slave mode if the second clock input is selected by the selector input of the multiplexer.

In an embodiment, if the first clock input is selected by the selector input of the multiplexer and the first and second configurable ICs may operate in a peer-to-peer mode, the clock signal generated by the first clock generator clocks the first transmitter to transmit data to the first receiver and the second transmitter transmits the clock signal generated by the first clock generator to the second configurable IC for clocking the second receiver to receive the data into the second configurable IC. In the particular embodiment described immediately above, if the second clock input is selected by the selector input of the multiplexer and the first and second configurable ICs operate in a master-slave mode, the clock signal generated by the second clock generator clocks the first transmitter to transmit the data to the first receiver and the second transmitter transmits the clock signal generated by the second clock generator to the first receiver to clock the first receiver to receive the data into the second configurable IC.

The first clock generator may include a first PLL circuit and the second clock generator may include a second PLL circuit. The first configurable IC may include a data source coupled to a data input of the first transmitter. The first configurable IC may be a field programmable gate array.

Figure 8:
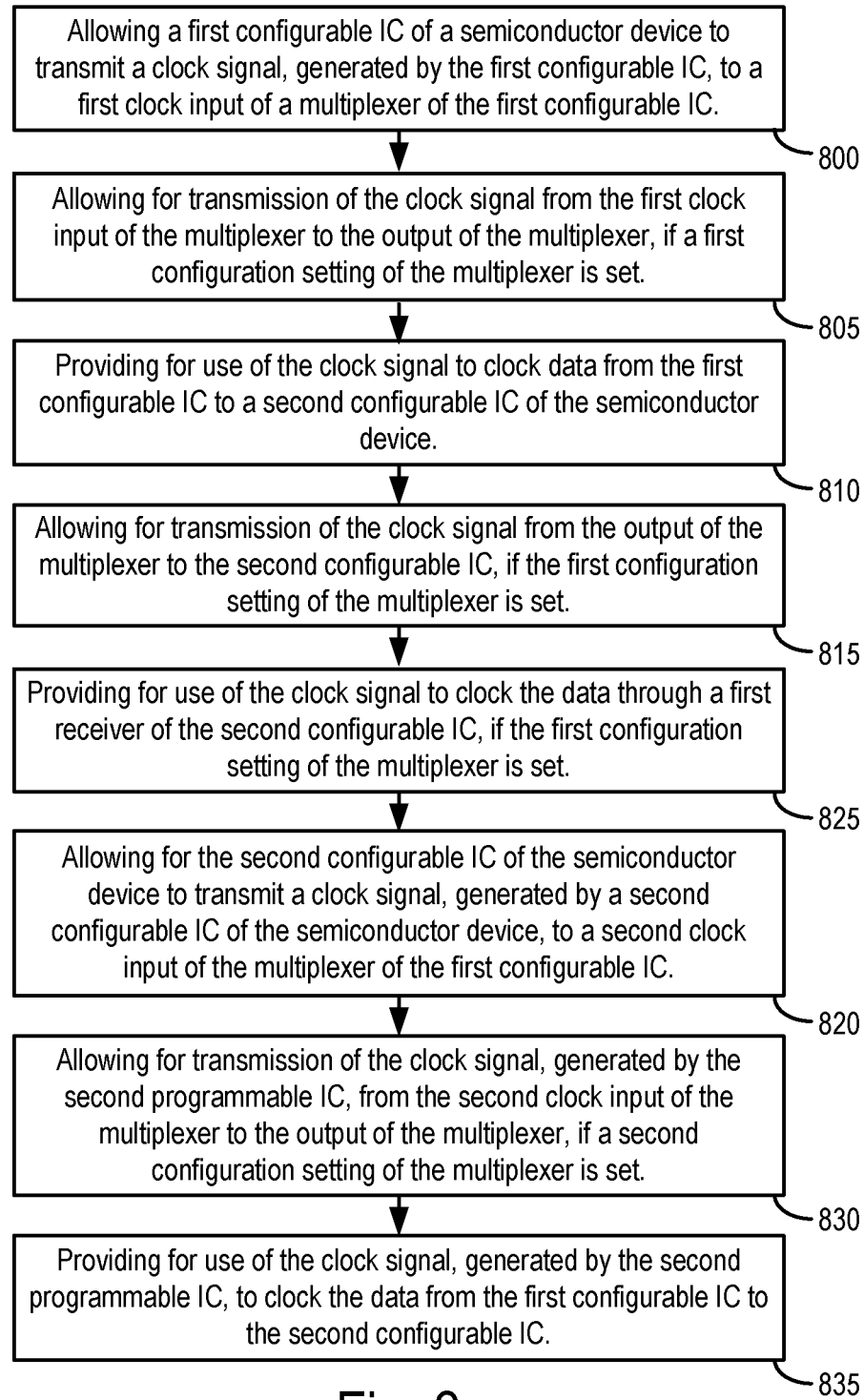
FIG. 8 shows a flow diagram for configuring a semiconductor device for operating in a peer-to-peer mode or a master-slave mode, in an embodiment.

FIG. 8 shows a flow diagram of configuring a semiconductor device, such as a SiP, that is programmatically configurable for operating in a peer-to-peer mode or for operating in a master-slave mode, in an embodiment. The high-level flow diagram represents one example embodiment. Steps may be added to, removed from, or combined in the flow diagram without deviating from the scope of the embodiment.

At 800, the method may include configuring a first configurable IC of a semiconductor device is configured for transmission of a clock signal, generated by the first configurable IC, to a first clock input of a multiplexer of the first configurable IC.

At 805, the method may include allowing for transmission of the clock signal, generated by the first configurable IC, from the first clock input of the multiplexer to the output of the multiplexer, if a first configuration setting of the multiplexer is set.

At 810, the method may include providing for use of the clock signal, generated by the first configurable IC, to clock data from the first configurable IC to a second configurable IC of the semiconductor device.

At 815, the method may include allowing for transmission of the clock signal, generated by the first configurable IC, from the output of the multiplexer to the second configurable IC, if the first configuration setting of the multiplexer is set.

At 820, the method may include providing for use of the clock signal, generated by the first configurable IC, to clock the data through a first receiver of the second configurable IC, if the first configuration setting of the multiplexer is set.

At 825, the method may include configuring the second configurable IC of the semiconductor device for transmission of a clock signal, generated by a second configurable IC of the semiconductor device, to a second clock input of the multiplexer of the first configurable IC.

At 830, the method may include allowing for transmission of the clock signal, generated by the second configurable IC, from the second clock input of the multiplexer to the output of the multiplexer, if a second configuration setting of the multiplexer is set.

At 835, the method may include providing for use of the clock signal, generated by the second configurable IC, to clock the data from the first configurable IC to the second configurable IC.

The method may include providing for use of the clock signal, generated by a second configurable IC, to clock data transmitted from the second configurable IC to the first configurable IC through a second receiver of the first configurable IC.

The method may include providing for use of the clock signal, generated by a second configurable IC, to clock the data transmitted from the first configurable IC to the second configurable IC through the first receiver of the second configurable IC, if the second configuration setting of the multiplexer is set.

The method may include providing for applying the first configuration setting to the multiplexer to couple the first clock input of the multiplexer to the output of the multiplexer; and providing for alternatively applying the second configuration setting to the multiplexer to couple the second clock input of the multiplexer to the output of the multiplexer.

The method may include providing a phase-locked loop of the second configurable IC to generate the clock signal transmitted from the second configurable IC to the second clock input of the multiplexer.

The method may include providing a phase-locked loop of the first configurable IC to generate the clock signal transmitted from the first configurable IC to the second configurable IC via the first clock input of the multiplexer.

In another embodiment, a semiconductor device includes a package substrate and a first configurable integrated circuit (IC), mounted on the package substrate. The first configurable IC may include a first configurable fabric, k*n number of first wires coupled to the first programmable fabric and extending from the first extendable fabric, n first time division multiplexers (TDMs) that are hardwired outside of the programmable fabric, and n first IO blocks. Each of the first TDMs may include k inputs that are coupled to k of the first wires and an output coupled to one of the first IO blocks.

The semiconductor device may include a second configurable IC, mounted on the package substrate. The second configurable IC may include a second programmable fabric, k*n second wires coupled to the second programmable fabric and extending from the second programmable fabric, n second TDMs hardwired outside of the second programmable fabric, and n second IO blocks. Each of the second TDMs may include k inputs that are coupled to k of the second wires and an output coupled to one of the second IO blocks, and the first and second IO blocks may be coupled in a one-to-one manner via the package substrate.

The first TDMs may not be formed in the first programmable fabric and the second TDMs may not be formed in the second programmable fabric. Each of the first wires may be coupled to one of the first TDMs and may not be coupled to second of the first TDMs. Each of the second wires may be coupled to one of the second TDMs and is not coupled to second of the second TDMs.

The package substrate may include an interconnect bridge and the first and second IO blocks are coupled in a one-to-one manner via the package substrate. The first configurable IC may include n first IO elements and each of the first IO blocks is coupled to one of the first IO elements. The second configurable IC may include n second IO elements and each of the second IO blocks is coupled to one of the second IO elements. The interconnect bridge may couple the first and second IO elements in a one-to-one manner. The n first TDMs may be hardwired outside of the programmable fabric.

This description has been presented for the purposes of illustration and description. It is not intended to be exhaustive or to limit the invention to the precise form described, and many modifications and variations are possible in light of the teaching above. For example, while SiP devices have been described above, embodiments described may be applied to a variety of multi-chip modules, multi-die assemblies, system-on-package devices, and other multi-die devices. The implementations were chosen and described in order to best explain the principles of the embodiments and their practical applications. This description will enable others skilled in the art to best utilize and practice the invention in various implementations and with various modifications as are suited to a particular use. The scope of the invention is defined by the following claims.

The invention claimed is:

1. A semiconductor device comprising:
   a first configurable integrated circuit (IC) comprising:
   a first input-output (IO) element,
   a second IO element,
   a third IO element,
   a multiplexer comprising a first clock input, a second clock input coupled to the third IO element and adapted to receive a clock signal via the third IO element, a clock output, and a selector input,
   a first transmitter comprising an output, wherein the output of the first transmitter is coupled to the first IO element,
   a second transmitter comprising an output, wherein the output of the second transmitter is coupled to the second IO element, and
   a first clock generator coupled between the clock output of the multiplexer and a clock input of the first transmitter and between the clock output of the multiplexer and a clock input of the second transmitter, wherein the first clock input of the multiplexer is adapted to receive a clock signal generated by the first clock generator.

2. The semiconductor device of claim 1 further comprising:
   a package substrate, wherein the first configurable IC is mounted on the package substrate; and
   a second configurable IC, mounted on the package substrate, comprising:
   a fourth IO element coupled to the first IO element of the first configurable IC via the package substrate,
   a fifth IO element coupled to the second IO element of the first configurable IC via the package substrate,
   a first receiver comprising an input, wherein the input of the first receiver is coupled to the fourth IO element,
   a second receiver comprising a first input, wherein the first input of the second receiver is coupled to the fifth IO element, and
   a second clock generator coupled between an output of the first receiver and a second input of the second receiver.

3. The semiconductor device of claim 2 wherein the second clock generator is adapted to receive a first signal via the second receiver from the output of the second transmitter, generate a clock signal using the first signal, and transmit the clock signal generated by the second clock generator to the second input of the second receiver.

4. The semiconductor device of claim 3 wherein the second configurable IC comprises a sixth IO element coupled to the third IO element of the first configurable IC via the package substrate, and the second configurable IC comprises a third transmitter comprising an input and an output, wherein the input of the third transmitter is adapted to receive a clock signal generated by the second clock generator and the output of the third transmitter is coupled to the sixth IO element.

5. The semiconductor device of claim 4 wherein the first and second configurable ICs operate in a peer-to-peer mode if the first clock input is selected by the selector input of the multiplexer, and the first and second configurable ICs operate in a master-slave mode if the second clock input is selected by the selector input of the multiplexer.

6. The semiconductor device of claim 5 wherein if the first clock input is selected by the selector input of the multiplexer and the first and second configurable ICs operate in a peer-to-peer mode, the clock signal generated by the first clock generator clocks the first transmitter to transmit data to the first receiver and the second transmitter transmits the clock signal generated by the first clock generator to the second configurable IC for clocking the second receiver to receive the data into the second configurable IC, and if the second clock input is selected by the selector input of the multiplexer and the first and second configurable ICs operate in a master-slave mode, the clock signal generated by the second clock generator clocks the first transmitter to transmit the data to the first receiver and the second transmitter transmits the clock signal generated by the second clock generator to the first receiver to clock the first receiver to receive the data into the second configurable IC.

7. The semiconductor device of claim 2 wherein the first clock generator comprises a first phase-locked loop (PLL) circuit and the second clock generator comprises a second PLL circuit.

8. The semiconductor device of claim 1 wherein the first configurable IC comprises a data source coupled to a data input of the first transmitter.

9. The semiconductor device of claim 1 wherein the first configurable IC is a first programmable gate array.

10. A method comprising:
    allowing a first configurable integrated circuit (IC) of a semiconductor device to transmit a clock signal, generated by the first configurable IC, to a first clock input of a multiplexer of the first configurable IC;
    allowing for transmission of the clock signal, generated by the first configurable IC, from the first clock input of the multiplexer to an output of the multiplexer, if a first configuration setting of the multiplexer is set;
    providing for use of the clock signal, generated by the first configurable IC, to clock data from the first configurable IC to a second configurable IC of the semiconductor device;
    allowing for transmission of the clock signal, generated by the first configurable IC, from the output of the multiplexer to the second configurable IC, if the first configuration setting of the multiplexer is set;
    providing for use of the clock signal, generated by the first configurable IC, to clock the data through a first receiver of the second configurable IC, if the first configuration setting of the multiplexer is set;
    allowing for the second configurable IC of the semiconductor device to transmit a clock signal, generated by the second configurable IC of the semiconductor device, to a second clock input of the multiplexer of the first configurable IC;
    allowing for transmission of the clock signal, generated by the second configurable IC, from the second clock input of the multiplexer to the output of the multiplexer, if a second configuration setting of the multiplexer is set; and
    providing for use of the clock signal, generated by the second configurable IC, to clock the data from the first configurable IC to the second configurable IC.

11. The method of claim 10 further comprising providing for use of the clock signal, generated by the second configurable IC, to clock data transmitted from the second configurable IC to the first configurable IC through a second receiver of the first configurable IC.

12. The method of claim 10 further comprising providing for use of the clock signal, generated by the second configurable IC, to clock the data transmitted from the first configurable IC to the second configurable IC through the first receiver of the second configurable IC, if the second configuration setting of the multiplexer is set.

13. The method of claim 10 further comprising providing for applying the first configuration setting to the multiplexer to couple the first clock input of the multiplexer to the output of the multiplexer; and providing for alternatively applying the second configuration setting to the multiplexer to couple the second clock input of the multiplexer to the output of the multiplexer.

14. The method of claim 10 further comprising providing a phase-locked loop of the second configurable IC to generate the clock signal transmitted from the second configurable IC to the second clock input of the multiplexer.

15. The method of claim 10 further comprising providing a phase-locked loop of the first configurable IC to generate the clock signal transmitted from the first configurable IC to the second configurable IC via the first clock input of the multiplexer.

\* \* \* \* \*